(12) United States Patent
Tanaka et al.

(10) Patent No.: US 10,199,457 B2
(45) Date of Patent: Feb. 5, 2019

(54) SILICON CARBIDE SEMICONDUCTOR DEVICE

(71) Applicant: Mitsubishi Electric Corporation, Chiyoda-ku (JP)

(72) Inventors: Rina Tanaka, Tokyo (JP); Yutaka Fukui, Tokyo (JP); Katsutoshi Sugawara, Tokyo (JP); Takeharu Kuroiwa, Tokyo (JP); Yasuhiro Kagawa, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/763,980

(22) PCT Filed: Sep. 29, 2016

(86) PCT No.: PCT/JP2016/078902
§ 371 (c)(1),
(2) Date: Mar. 28, 2018

(87) PCT Pub. No.: WO2017/094339
PCT Pub. Date: Jun. 8, 2017

(65) Prior Publication Data
US 2018/0358429 A1 Dec. 13, 2018

(30) Foreign Application Priority Data
Dec. 3, 2015 (JP) .................. 2015-236370

(51) Int. Cl.
*H01L 29/06* (2006.01)
*H01L 29/16* (2006.01)
(Continued)

(52) U.S. Cl.
CPC .......... *H01L 29/063* (2013.01); *H01L 21/049* (2013.01); *H01L 21/0465* (2013.01);
(Continued)

(58) Field of Classification Search
CPC .. H01L 29/063; H01L 29/1608; H01L 29/045
See application file for complete search history.

(56) References Cited

U.S. PATENT DOCUMENTS 9,337,271 B2 5/2016 Fukui et al.
9,425,261 B2 8/2016 Fukui et al.
(Continued)

FOREIGN PATENT DOCUMENTS

JP 2009-194065 A 8/2009
JP 2011-100967 A 5/2011
(Continued)

OTHER PUBLICATIONS

International Search Report dated Dec. 13, 2016 in PCT/JP2016/078902, filed on Sep. 29, 2016.

*Primary Examiner* — Anthony Ho
(74) *Attorney, Agent, or Firm* — Oblon, McClelland, Maier & Neustadt, L.L.P.

(57) ABSTRACT

A silicon carbide semiconductor device includes a silicon carbide drift layer formed on an upper surface of a silicon carbide semiconductor substrate having an off angle, a body region, a source region, a plurality of trenches, a gate insulating film, a gate electrode, a source electrode, a drain electrode, and a depletion suppressing layer. The depletion suppressing layer is positioned to be sandwiched between the plurality of trenches in a plan view, and in a direction with the off angle of the silicon carbide semiconductor substrate, a distance between the depletion suppressing layer and one of the trenches adjacent to the depletion suppressing layer is different from another distance between the depletion suppressing layer and the other one of the trenches adjacent to the depletion suppressing layer.

17 Claims, 6 Drawing Sheets

(51) Int. Cl.

|  |  |  |
|---|---|---|
| *H01L 29/04* | (2006.01) | |
| *H01L 21/04* | (2006.01) | |
| *H01L 29/78* | (2006.01) | |
| *H01L 29/66* | (2006.01) | |
| *H01L 29/10* | (2006.01) | |

(52) U.S. Cl.
CPC ........ *H01L 29/045* (2013.01); *H01L 29/1095* (2013.01); *H01L 29/1608* (2013.01); *H01L 29/66068* (2013.01); *H01L 29/7813* (2013.01)

(56) References Cited

U.S. PATENT DOCUMENTS

| 2011/0012195 A1 | 1/2011 | Momota et al. |
| 2011/0017998 A1 | 1/2011 | Nakano et al. |
| 2013/0140586 A1 | 6/2013 | Takahashi et al. |

FOREIGN PATENT DOCUMENTS

| JP | 2012-253391 A | 12/2012 |
| JP | 2015-065365 A | 4/2015 |
| JP | 5840308 B2 | 1/2016 |
| JP | 5893172 B2 | 3/2016 |
| WO | 2013/001782 A1 | 1/2013 |

SILICON CARBIDE SEMICONDUCTOR DEVICE

TECHNICAL FIELD

A technique disclosed in the present specification relates to a silicon carbide semiconductor device, and more particularly to, for example, a silicon carbide semiconductor device having a trench gate.

BACKGROUND ART

As power switching elements, power metal-oxide-semiconductor field-effect transistors (i.e., MOSFETs) (hereinafter, sometimes referred to as power MOSFETs) are widely used. Among them, in order to increase the channel width density, a trench gate type MOSFET has been put into practical use, in which a trench is formed on a surface of a semiconductor wafer and a side surface of, the trench is used as a channel. In the trench gate type MOSFET, since a gate structure is formed inside the trench, it is possible to reduce the cell pitch. Therefore, it is possible to increase the performance of the device.

In recent years, as a next-generation power device of high breakdown voltage and low loss, attention is focused on a trench gate type SiC-MOSFET using silicon carbide (SiC). In most cases, in a SiC substrate used for manufacturing this type of device, an off angle is provided on a crystal plane. In a case where a trench is formed on the SiC substrate having an off angle, usually, side wall surfaces of the trench are surfaces which have different angles from the crystal axis (see, for example, Patent Document 1).

PRIOR ART DOCUMENTS

Patent Documents

[Patent Document 1] Japanese Patent Application Laid-Open No. 2011-100967

SUMMARY

Problem to be Solved by the Invention

As exemplarily shown in Patent Document 1, for example, in a trench gate type MOSFET manufactured by using a 4H—SiC substrate having an off angle, usually, side wall surfaces of a trench are surfaces which have different angles from the crystal axis. In the trench gate type MOSFET, since a channel is formed on a side wall surface of the trench, due to the differences of the crystal planes on the side wall surfaces of the trench, respective ON-state currents and threshold voltages are different. Then, there arises a problem that a variation in the current is caused inside element surfaces and this deteriorates the operational stability and the reliability of the element.

The technique disclosed in the present specification is intended to solve the above-described problem, and relates to a trench gate type silicon carbide semiconductor device manufactured on a silicon carbide semiconductor substrate having an off angle, more particularly to a silicon carbide semiconductor device which makes it possible to suppress a variation in the ON-state current and a variation in the threshold value voltage depending on a crystal plane.

Means to Solve the Problem

A silicon carbide semiconductor device according to one aspect of the technique disclosed in the present specification includes a silicon carbide drift layer of a first conductivity type formed on an upper surface of a silicon carbide semiconductor substrate having an off angle, a body region of a second conductivity type formed on an upper surface of the silicon carbide drift layer, a source region of the first conductivity type which is partially formed on a surface layer of the body region, a plurality of trenches penetrating the body region from an upper surface of the source region, to reach the silicon carbide drift layer, a gate insulating film formed on a wall surface inside each of the plurality of trenches, a gate electrode which is so formed inside each of the plurality of trenches as to cover the gate insulating film, a source electrode which is so formed as to cover the source region, a drain electrode formed on a lower surface side of the silicon carbide drift layer, and a depletion suppressing layer of the first conductivity type which is formed on a lower surface of the body region and has an impurity concentration higher than that of the silicon carbide drift layer, and in the silicon carbide semiconductor device, the depletion suppressing layer is so positioned as to be sandwiched between the plurality of trenches in a plan view, and a distance between the depletion suppressing layer and one of the trenches adjacent to the depletion suppressing layer is different from a distance between the depletion suppressing layer and the other one of the trenches adjacent to the depletion suppressing layer in a direction with the off angle of the silicon carbide semiconductor substrate.

A silicon carbide semiconductor device according to another aspect of the technique disclosed in the present specification includes a silicon carbide drift layer of a first conductivity type formed on an upper surface of a silicon carbide semiconductor substrate having an off angle, a body region of a second conductivity type formed on an upper surface of the silicon carbide drift layer, a source region of the first conductivity type which is partially formed on a surface layer of the body region, a plurality of trenches penetrating the body region from an upper surface of the source region, to reach the silicon carbide drift layer, a gate insulating film formed on a wall surface inside each of the plurality of trenches, a gate electrode which is so formed inside each of the plurality of trenches as to cover the gate insulating film, a source electrode which is so formed as to cover the source region, a drain electrode formed on a lower surface side of the silicon carbide drift layer, and a depletion suppressing layer of the first conductivity type which is formed on a lower surface of the body region and has an impurity concentration higher than that of the silicon carbide drift layer, and in the silicon carbide semiconductor device, the depletion suppressing layer is so positioned as to be sandwiched between the plurality of trenches in a plan view, the depletion suppressing layer has a first layer positioned on a downward side of a crystal plane inclined by the off angle from the upper surface of the silicon carbide drift layer and a second layer positioned on an upward side of the crystal plane inclined by the off angle from the upper surface of the silicon carbide drift layer, and the first layer has an impurity concentration higher than that of the second layer.

Effects of the Invention

The silicon carbide semiconductor device according to one aspect of the technique disclosed in the present specification includes a silicon carbide drift layer of a first conductivity type formed on an upper surface of a silicon carbide semiconductor substrate having an off angle, a body region of a second conductivity type formed on an upper surface of the silicon carbide drift layer, a source region of the first conductivity type which is partially formed on a surface layer of the body region, a plurality of trenches penetrating the body region from an upper surface of the source region, to reach the silicon carbide drift layer, a gate insulating film formed on a wall surface inside each of the plurality of trenches, a gate electrode which is so formed inside each of the plurality of trenches as to cover the gate insulating film, a source electrode which is so formed as to cover the source region, a drain electrode formed on a lower surface side of the silicon carbide drift layer, and a depletion suppressing layer of the first conductivity type which is formed on a lower surface of the body region and has an impurity concentration, higher than that of the silicon carbide drift layer, and in the silicon carbide semiconductor device, the depletion suppressing layer is so positioned as to be sandwiched between the plurality of trenches in a plan view, and a distance between the depletion suppressing layer and one of the trenches adjacent to the depletion suppressing layer is different from a distance between the depletion suppressing layer and the other one of the trenches adjacent to the depletion suppressing layer in a direction with the off angle of the silicon carbide semiconductor substrate. In such a structure, by adjusting the distance between the depletion suppressing layer and the side wall surface of the trench in accordance with the crystal plane, it is possible to suppress the difference in the ON-state current among the side wall surfaces of each trench and suppress the variation in the current and the variation in the threshold voltage in the silicon carbide semiconductor device. Therefore, it is possible to achieve a silicon carbide semiconductor device which is stable and ensures high reliability.

The silicon carbide semiconductor device according to another aspect of the technique disclosed in the present specification includes a silicon carbide drift layer of a first conductivity type formed on an upper surface of a silicon carbide semiconductor substrate having an off angle, a body region of a second conductivity type formed on an upper surface of the silicon carbide drift layer, a source region of the first conductivity type which is partially formed on a surface layer of the body region, a plurality of trenches penetrating the body region from an upper surface of the source region, to reach the silicon carbide drift layer, a gate insulating film formed on a wall surface inside each of the plurality of trenches, a gate electrode which is so formed inside each of the plurality of trenches as to cover the gate insulating film, a source electrode which is so formed as to cover the source region, a drain electrode formed on a lower surface side of the silicon carbide drift layer, and a depletion suppressing layer of the first conductivity type which is formed on a lower surface of the body region and has an impurity concentration higher than that of the silicon carbide drift layer, and in the silicon carbide semiconductor device, the depletion suppressing layer is so positioned as to be sandwiched between the plurality of trenches in a plan view, the depletion suppressing layer has a first layer positioned on a downward side of a crystal plane inclined by the off angle from the upper surface of the silicon carbide drift layer and a second layer positioned on an upward side of the crystal plane inclined by the off angle from the upper surface of the silicon carbide drift layer, and the first layer has an impurity concentration higher than that of the second layer. In such a structure, by adjusting the distance between the depletion suppressing layer and the side wall surface of the trench in accordance with the crystal plane, it is possible to suppress the difference in the ON-state current among the side wall surfaces of each trench and suppress the variation in the current and the variation in the threshold voltage in the silicon carbide semiconductor device. Therefore, it is possible to achieve a silicon carbide semiconductor device which is stable and ensures high reliability.

These and other objects, features, aspects and advantages of the technique disclosed in the present specification will become more apparent from the following detailed description of the present invention when taken in conjunction with the accompanying drawings.

DESCRIPTION OF EMBODIMENT(S)

Hereinafter, with reference t a ached figures, description will be made on the preferred embodiments. Figures are schematically shown, and the correlation in the size and position among images shown in different figures is not always represented accurately but may be changed as appropriate. Further, in the following description, identical constituent elements are represented by the same reference signs and each have the same name and function. Therefore, detailed description thereof will be omitted in some cases.

Furthermore, in the following description, even in a case of using words such as "upper", "lower", "side", "bottom", "front", "back", and the like, which mean specific positions and directions, these words are used for convenience to easily understand the contents of the preferred embodiments, and have no relation to actual directions used when the embodiments are carried out.

The First Preferred Embodiment

Hereinafter, a silicon carbide semiconductor device in accordance with the present preferred embodiment will be described. Further, in the following description, it is assumed that a first conductivity type is n type and a second conductivity type is p type.

<Structure of Silicon Carbide Semiconductor Device>

Figure 1:
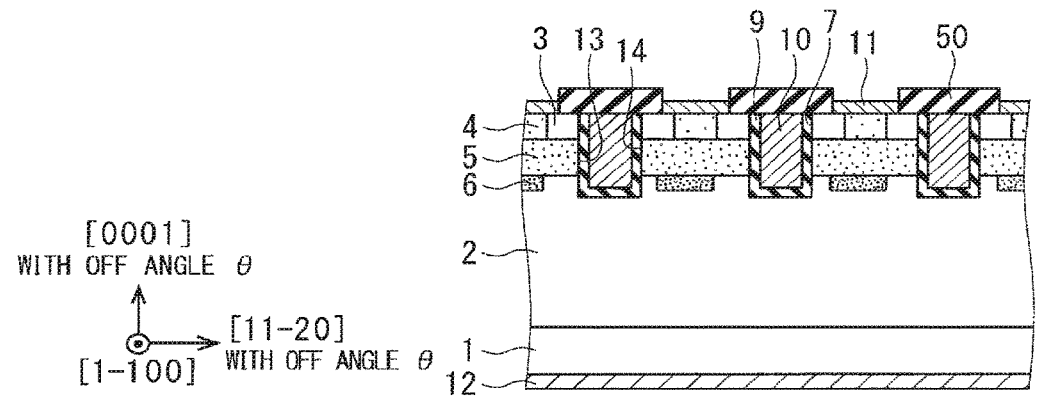
FIG. 1 is a cross section schematically showing an exemplary structure to achieve a silicon carbide semiconductor device in accordance with a preferred embodiment.

FIG. 1 is a cross section schematically showing an exemplary structure to achieve a silicon carbide semiconductor device in accordance with the present preferred embodiment. In FIG. 1, an upper direction of the paper is a [0001] direction with an off angle θ, a right direction of the paper is a [11-20] direction with the off angle θ, and a frontward direction of the paper is a [1-100] direction.

As exemplarily shown in FIG. 1, the silicon carbide semiconductor device includes an n-type silicon carbide semiconductor substrate 1, an n-type silicon carbide drift layer 2 which is formed on an upper surface of the silicon carbide semiconductor substrate 1 and has an n-type impurity concentration lower than that of the silicon carbide semiconductor substrate 1, a plurality of n-type source regions 3 which are partially formed on a surface of the silicon carbide drift layer 2 and have an n-type impurity concentration higher than that of the silicon carbide drift layer 2, a plurality of p-type body contact regions 4 which are so positioned as to be sandwiched between the source regions 3 in a plan view and have a high p-type impurity concentration, a p-type body region 5 formed at a position in contact with a lower surface of the source region 3 and a lower surface of the body contact region 4, and a plurality of trenches 7 formed, penetrating the body region 5 from the surface of the silicon carbide drift layer 2.

The silicon carbide semiconductor device further includes a gate insulating film 9 formed on a wall surface inside each of the trenches 7, and a gate electrode 10 which is so formed inside each of the trenches 7 as to cover the gate insulating film 9. An interlayer insulating film 50 is so formed as to cover the gate electrode 10. A source electrode 11 is formed across an upper surface of each of the body contact regions 4 and an upper surface of each of the source regions 3. Further, a drain electrode 12 is formed on a back side of the silicon carbide semiconductor substrate 1.

An n-type depletion suppressing layer 6 having an impurity concentration higher than that of the silicon carbide drift layer 2 is formed on a lower surface of the p-type body region 5 which is an active region, i.e., in the vicinity of an interface between the body region 5 and the silicon carbide drift layer 2. The depletion suppressing layer 6 is positioned between two adjacent trenches 7 in a plan view. The depletion suppressing layer 6 is formed away from a first side wall surface 13 of one trench 7 by a first distance X1. Herein, the first side wall surface 13 in the one trench 7 is a side wall surface nearer to the depletion suppressing layer 6. Further, the depletion suppressing layer 6 is formed away from a second side wall surface 14 of the other trench 7, i.e., another trench 7 which sandwiches the depletion suppressing layer 6 with the one trench 7, which is positioned opposite to the first side wall surface 13, by a second distance X2. Herein, the second side wall surface 14 in the other trench 7 is a side wall surface nearer to the depletion suppressing layer 6. The second distance X2 is shorter than the first distance X1.

Figure 2:
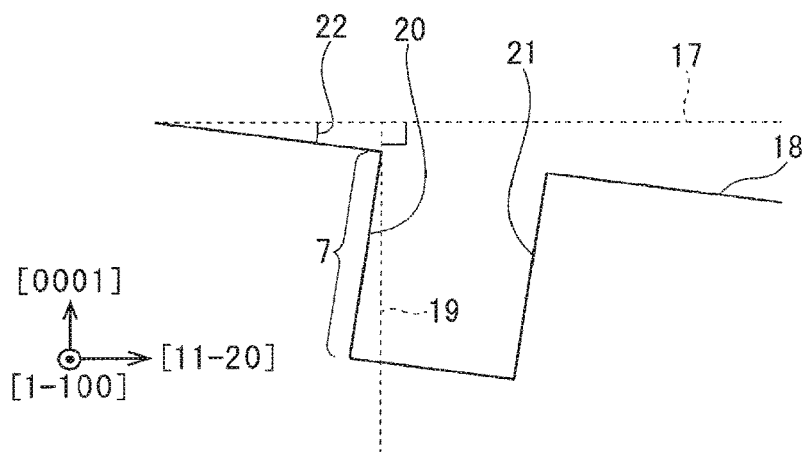
FIG. 2 is a view schematically showing an exemplary relation of crystal planes of a trench in the silicon carbide semiconductor device in accordance with the preferred embodiment.

FIG. 2 is a view schematically showing an exemplary relation of crystal planes of the trench in the silicon carbide semiconductor device in accordance with the present preferred embodiment. In FIG. 2, an upper direction of the paper is the [0001] direction, a right direction of the paper is the [11-20] direction, and a frontward direction of the paper is the [1-100] direction.

Further, a plane 17 is a (0001) plane, a plane 18 is a (0001) plane with the off angle θ, i.e., an upper surface of the silicon carbide drift layer 2, a plane 19 is a (11-20) plane, a plane 20 is a (11-20) plane with the off angle θ, and a plane 21 is a (−1-120) plane with the off angle θ. An angle 22 is an off angle θ.

The structure exemplarily shown in FIG. 1 is formed on the silicon carbide semiconductor substrate 1 with the off angle θ in the [11-20] direction, like in FIG. 2. For this reason, the first side wall surface 13 of the trench 7 is the (11-20) plane with the off angle θ, and the second side wall surface 14 opposite to the first side wall surface 13 is the (−1-120) plane with the off angle θ.

Figure 18:
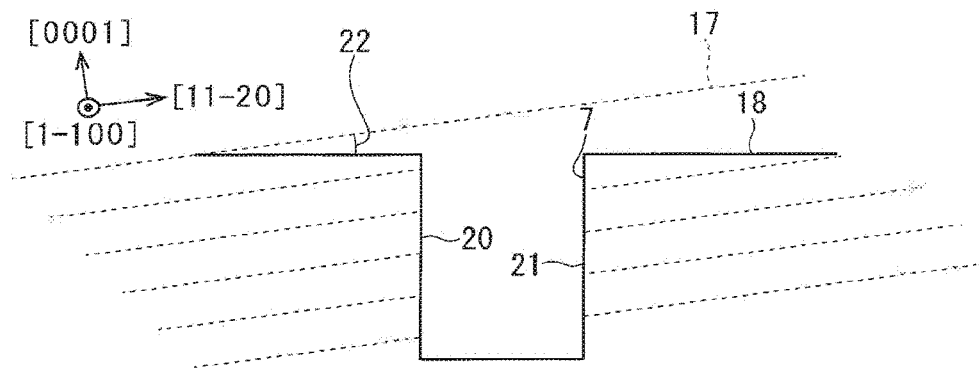
FIG. 18 is a view schematically showing an exemplary relation of the crystal planes of the trench in the silicon carbide semiconductor device in accordance with the preferred embodiment.

FIG. 18 is a view schematically showing an exemplary relation of the crystal planes of the trench in the silicon carbide semiconductor device in accordance with the present preferred embodiment. In FIG. 18, the same structure as exemplarily shown in FIG. 2 is shown with the plane 18 in FIG. 2, i.e., the upper surface of the silicon carbide drift layer 2 as a reference.

As exemplarily shown in FIG. 2, a downward direction of a crystal plane inclined from the upper surface of the silicon carbide drift layer 2 by the off angle, such as the plane 17, is a left direction of the paper. Similarly, an upward direction of a crystal plane inclined from the upper surface of the silicon carbide drift layer 2 by the off angle, such as the plane 17, is a right direction of the paper. Therefore, the first side wall surface 13 of the trench 7 (the plane 20 in FIG. 2) which is the (11-20) plane with the off angle θ is a side wall surface in the upward direction of the crystal plane inclined from the upper surface of the silicon carbide drift layer 2 by the off angle. Similarly, the second side wall surface 14 of the trench 7 (the plane 21 in FIG. 2) which is the (−1-120) plane with the off angle θ is a side wall surface in the downward direction of the crystal plane inclined from the upper surface of the silicon carbide drift layer 2 by the off angle.

<Manufacturing Method of Silicon Carbide Semiconductor Device>

Figure 3:
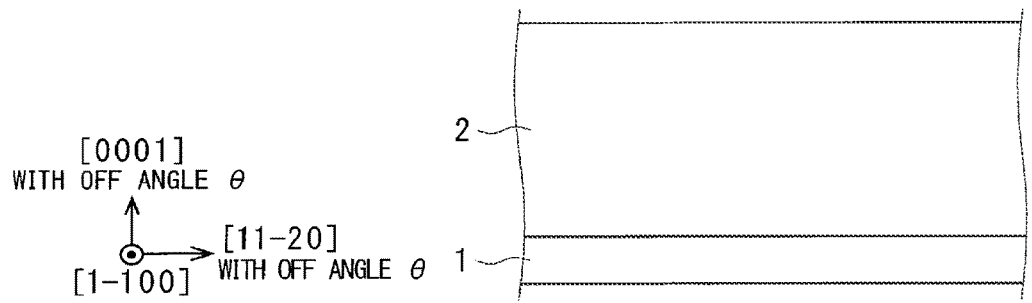
FIG. 3 is a cross section showing a method of manufacturing the silicon carbide semiconductor device in accordance with the preferred embodiment.
Figure 4:
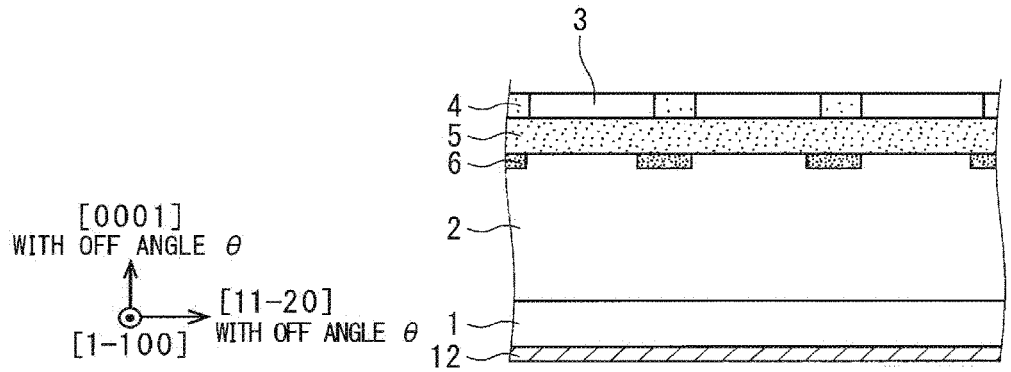
FIG. 4 is a cross section showing the method of manufacturing the silicon carbide semiconductor device in accordance with the preferred embodiment.
Figure 5:
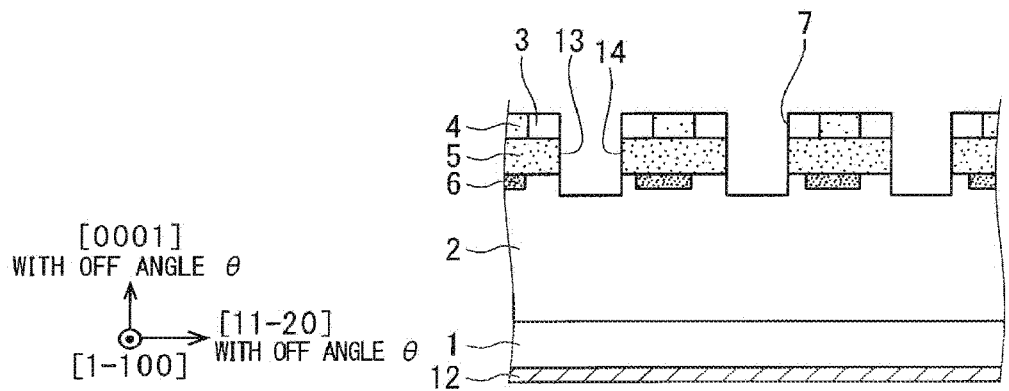
FIG. 5 is a cross section showing the method of manufacturing the silicon carbide semiconductor device in accordance with the preferred embodiment.

The above-described structure can be manufactured by a manufacturing method described below. FIGS. 3 to 5 are cross sections each showing a method of manufacturing the silicon carbide semiconductor device in accordance with the present preferred embodiment. In FIGS. 3 to 5, an upper direction of the paper is the [0001] direction with an off angle θ, a right direction of the paper is the [11-20] direction with the off angle θ, and a frontward direction of the paper is the [1-100] direction.

As exemplarily shown in FIG. 3, first, an n-type silicon carbide layer which is to be the silicon carbide drift layer 2 is formed on the upper surface of the n-type silicon carbide semiconductor substrate 1 by the epitaxial growth method. After that, as exemplarily shown in FIG. 4, the source region 3, the body contact region 4, the body region 5, and the depletion suppressing layer 6 are formed on the surface of the silicon carbide drift layer 2 by ion implantation or epitaxial growth. At that time, the source region 3 is formed of donor impurity having a concentration of about $1\times10^{19}$ $cm^{-3}$. Further, the body contact region 4 is formed of acceptor impurity having a concentration of about $1\times10^{20}$ $cm^{-3}$. The concentration of the acceptor impurity of the body region 5 is preferably not lower than $1\times10^{14}$ $cm^{-3}$ and not higher than $1\times10^{18}$ $cm^{-3}$ and the concentration and the thickness may not be uniform. The concentration of the depletion suppressing layer 6 is preferably not lower than $1\times10^{17}$ $cm^{-3}$ and not higher than $5\times10^{17}$ $cm^{-3}$, and the thickness thereof is about 0.3 μm.

After that, as exemplarily shown in FIG. 5, the trench 7 is so formed by etching as to penetrate the source region 3 and the body region 5. At that time, a position where the first side wall surface 13 is formed in the (11-20) plane with the off angle θ in the trench 7 which is so formed as to penetrate the center of the source region 3 is away from the depletion suppressing layer 6 by the first distance X1, and a position where the second side wall surface 14 is formed in the (−1-120) plane with the off angle θ is away from the depletion suppressing layer 6 by the second distance X2 shorter than the first distance X1. Further, when the second distance X2 is 0, the second side wall surface 14 is in contact with the depletion suppressing layer 6. Furthermore, the order of the process steps for forming the trench 7 may be changed.

Then, the gate insulating film 9 is formed on the wall surface inside the trench 7, and the gate electrode 10 is further formed inside the trench 7. The source electrode 11 is formed across the upper surface of each of the body contact regions 4 and the upper surface of each of the source regions 3. The drain electrode 12 is formed on the back side of the silicon carbide semiconductor substrate 1. By executing this process, the silicon carbide semiconductor device having the cell structures exemplarily shown in FIG. 1 can be manufactured.

Figure 6:
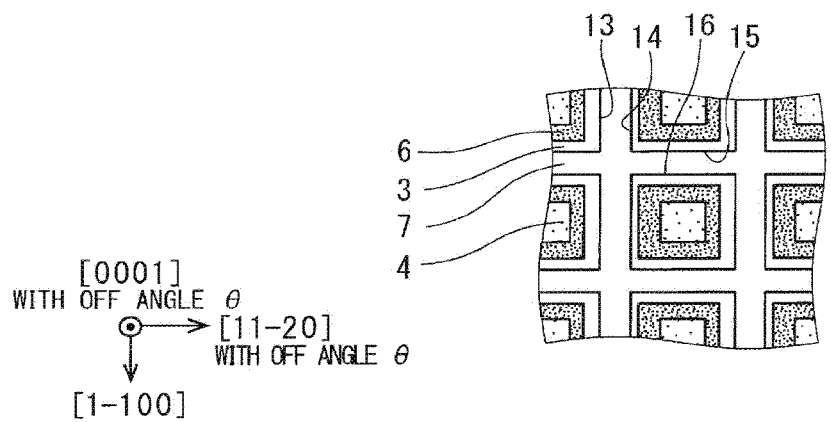
FIG. 6 is a plan view showing a case where exemplary cell structures shown in FIG. 1 are arranged like a lattice, with part of the structure illustrated transparently.
Figure 7:
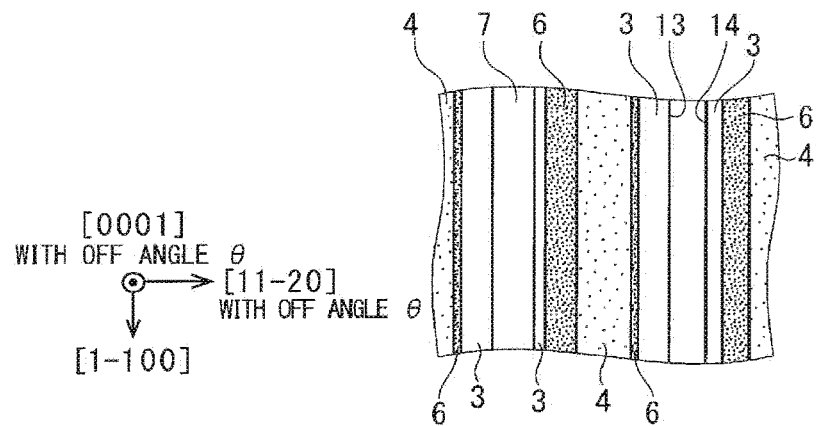
FIG. 7 is a plan view showing a case where the exemplary cell structures shown in FIG. 1 are arranged in stripes, with part of the structure illustrated transparently.

The structure exemplarily shown in FIG. 1 may be arranged like a lattice as exemplarily shown in FIG. 6 or arranged in stripes as exemplarily shown in FIG. 7. FIG. 6 is a plan view showing a case where the cell structures shown in FIG. 1 are arranged like a lattice, with part of the structure illustrated transparently. FIG. 7 is a plan view showing a case where the cell structures shown in FIG. 1 are arranged in stripes, with part of the structure illustrated transparently. In FIGS. 6 and 7, a frontward direction of the paper is the [0001] direction with the off angle θ, a right direction of the paper is the [11-20] direction with the off angle θ, and a lower direction of the paper is the [1-100] direction.

In the case of lattice arrangement shown in FIG. 6, the cells may not be aligned, and each cell may have a polygon or a shape in which the corner of the cell has a curvature. In the case of lattice arrangement shown in FIG. 6, each of the source region 3 and the body contact region 4 is formed like an island. In the case of stripe arrangement shown in FIG. 7, each of the source region 3 and the body contact region 4 is formed like a stripe. In any case, below the source region 3 and the body contact region 4, the body region 5 is formed at a position overlapping the source region 3 and the body contact region 4 in a plan view.

With the side wall surface of each of the trenches 7 which are formed like a lattice or in stripes, a side surface of the source region 3 is in contact. Further, though not shown herein, in the outer periphery of a pattern region in which the cell structures are formed, a terminal region is formed. As the terminal region, assumed is, for example, a region obtained by forming a p-type impurity layer on an element surface, or a region obtained by forming a p-type impurity layer on a bottom surface of the trench formed by etching. On the lower surface of the body region 5 which is the active region, formed is the depletion suppressing layer 6. The depletion suppressing layer 6 is so positioned as to have a different distance from the trench 7 depending on the crystal plane.

In the case of lattice arrangement shown in FIG. 6, the distance from the first side wall surface 13 corresponding to the (11-20) plane with the off angle θ in the trench 7 to the depletion suppressing layer 6 is the first distance X1, and the distance from the second side wall surface 14 corresponding to the (−1-120) plane with the off angle θ to the depletion suppressing layer 6 is the second distance X2. Herein, the second distance X2 is shorter than the first distance X1.

Further, it is assumed that the distance from a third side wall surface 15 corresponding to a (1-100) plane orthogonal to these two planes to the depletion suppressing layer 6 is a third distance X3 and the distance from a fourth side wall surface 16 corresponding to a (−1100) plane orthogonal to these two planes to the depletion suppressing layer 6 is, a fourth distance X4. Herein, each of the third distance X3 and the fourth distance X4 is a distance which has a value between the first distance X1 and the second distance X2, and in other words, is longer than the second distance X2 and shorter than the first distance X1. The third distance X3 and the fourth distance X4 are preferably equal to each other but may have different values.

In the case of stripe arrangement shown in FIG. 7, when the direction of the stripes is an up-and-down direction, i.e., in parallel with the [1-100] direction, the distance from the first side wall surface 13 of the trench 7 to the depletion suppressing layer 6 is the first distance X1, and the distance from the second side wall surface 14 to the depletion suppressing layer 6 is the second distance X2. Herein, the second distance X2 is shorter than the first distance X1. On the other hand, when the direction of the stripes is a left and right direction, i.e., in parallel with the [11-20] direction with the off angle θ, the distance from the third side wall surface 15 to the depletion suppressing layer 6 is the third distance X3 and the distance from the fourth side wall surface 16 to the depletion suppressing layer 6 is the fourth distance X4. Herein, the third distance X3 and the fourth distance X4 are preferably equal to each other but may have different values. This is because the side wall surface of the trench 7 has no effect of the off angle since the stripes are in parallel with the direction with the off angle when the direction of the stripes is the left and right direction of the paper.

In the above-described structure, the following effects can be produced.

Figure 11:
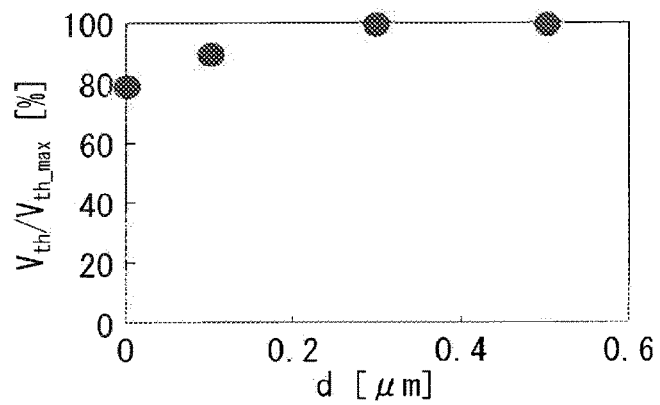
FIG. 11 is a graph exemplarily showing a calculation result of a relation of a threshold voltage with respect to a distance between a depletion suppressing layer and a side wall surface of the trench in the silicon carbide semiconductor device in accordance with the preferred embodiment.
Figure 12:
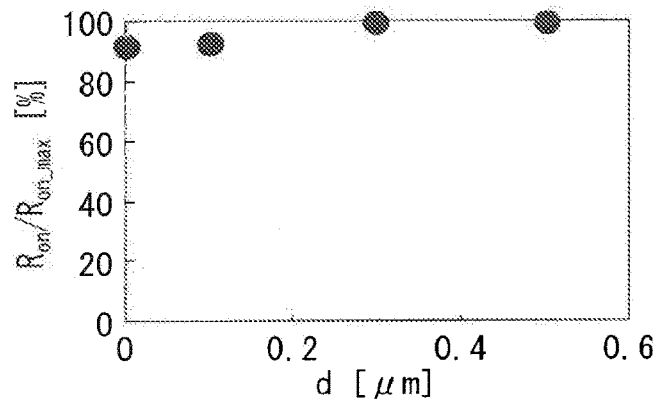
FIG. 12 is a graph exemplarily showing a calculation result of a relation of an ON-resistance with respect to a distance between the depletion suppressing layer and the side wall surface of the trench in a case where a gate voltage is 15 V in the silicon carbide semiconductor device in accordance with the preferred embodiment.
Figure 13:
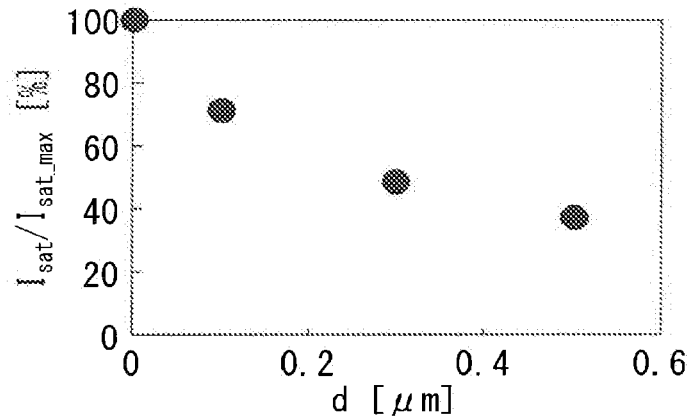
FIG. 13 is a graph exemplarily showing a calculation result of a relation of a saturation current with respect to a distance between the depletion suppressing layer and the side wall surface of the trench in the silicon carbide semiconductor device in accordance with the preferred embodiment.

FIG. 11 is a graph exemplarily showing a calculation result of a relation of a threshold voltage with respect to the distance between the depletion suppressing layer 6 and the side wall surface of the trench 7 in the silicon carbide semiconductor device in accordance with the present preferred embodiment. In FIG. 11, the vertical axis represents a ratio of the calculated threshold voltage to a maximum value by percentage, and the horizontal axis represents the distance [μm] between the depletion suppressing layer 6 on the lower surface of the body region 5 and the side wall surface of the trench 7 (which may be any one of the first side wall surface 13 and the second side wall surface 14). FIG. 12 is a graph exemplarily showing a calculation result of a relation of an ON-resistance with respect to the distance between the depletion suppressing layer 6 and the side wall surface of the trench 7 in a case where a gate voltage is 15 V in the silicon carbide semiconductor device in accordance with the present preferred embodiment. In FIG. 12, the vertical axis represents a ratio of the calculated ON-resistance to a maximum value by percentage, and the horizontal axis represents the distance [μm] between the depletion suppressing layer 6 on the lower surface of the body region 5 and the side wall surface of the trench 7. FIG. 13 is a graph exemplarily showing a calculation result of a relation of a saturation current with respect to the distance between the depletion suppressing layer 6 and the side wall surface of the trench 7 in the silicon carbide semiconductor device in accordance with the present preferred embodiment. In FIG. 13, the vertical axis represents a ratio of the calculated saturation current to a maximum value by percentage, and the horizontal axis represents the distance [μm] between the depletion suppressing layer 6 on the lower surface of the body region 5 and the side wall surface of the trench 7.

In FIGS. 11 to 13, the structure is formed, assuming that the p-type impurity concentration of the body region 5 is $3\times10^{17}$ cm$^{-3}$, the n-type impurity concentration of the depletion suppressing layer 6 is $5\times10^{17}$ cm$^{-3}$ and the distance between the depletion suppressing layer 6 on the lower surface of the body region 5 and the side wall surface of the trench 7 is not shorter than about 0.1 μm and not longer than about 0.5 μm.

As exemplarily shown in FIG. 11, the threshold voltage of the silicon carbide semiconductor device increases as the distance between the depletion suppressing layer 6 and the side wall surface of the trench 7 becomes longer. In an area where the distance between the depletion suppressing layer 6 and the side wall surface of the trench 7 is not shorter than 0.3 μm, however, the change rate is small. This is because a profile of a channel region formed on the side wall surface of the trench 7 is affected when the depletion suppressing layer 6 is formed in the vicinity of the trench 7.

As exemplarily shown in FIG. 12, similarly, the ON-resistance of the silicon carbide semiconductor device also increases as the distance between the depletion suppressing layer 6 and the side wall surface of the trench 7 becomes longer. Such a clear saturation tendency found in the case of FIG. 11, however, cannot be found herein.

In a region where no depletion suppressing layer 6 is formed, a depletion layer widely extends from the body region 5. For this reason, a path for the ON-state current becomes narrower when the depletion suppressing layer 6 is not formed in the vicinity of the side wall surface of the trench 7, and the ON-resistance increases. When the distance between the depletion suppressing layer 6 and the side wall surface of the trench 7 becomes longer, since the region where the depletion layer extends expands, the ON-resistance increases.

As exemplarily shown in FIG. 13, a saturation current value of the silicon carbide semiconductor device decreases as the distance between the depletion suppressing layer 6 and the side wall surface of the trench 7 becomes longer. When the distance between the depletion suppressing layer 6 and the side wall surface of the trench 7 becomes about 0.5 μm or longer, however, the change rate becomes small.

From the results shown in FIGS. 11 to 13, it is found that the effect that the depletion suppressing layer 6 gives the properties of the silicon carbide semiconductor device becomes larger as the distance between the depletion suppressing layer 6 and the side wall surface of the trench 7 becomes shorter, and in the above-described structure condition, for example, it is preferable that the distance between the depletion suppressing layer 6 and the side wall surface of the trench 7 should be about 0.3 μm, depending on the crystal plane. Further, since the optimum distance between the depletion suppressing layer 6 and the side wall surface of the trench 7 and the preferable change rate of each of the properties of the silicon carbide semiconductor device are different depending on the structure condition of the used element, the values are not limited to these shown in FIGS. 11 to 13.

Thus, in the silicon carbide semiconductor device of the present preferred embodiment, since the channel characteristics are changed depending on the arrangement of the depletion suppressing layer 6, by adjusting the distance between the depletion suppressing layer 6 and the side wall surface of the trench 7, it is possible to control the On-state characteristics and reduce a variation in the current in the element surface due to the off angle θ.

The Second Preferred Embodiment

A silicon carbide semiconductor device in accordance with the present preferred embodiment will be described. In the following description, constituent elements identical to those described in the above-described preferred embodiment are represented by the same reference signs and detailed description thereof will be omitted as appropriate.

<Structure of Silicon Carbide Semiconductor Device>

Figure 8:
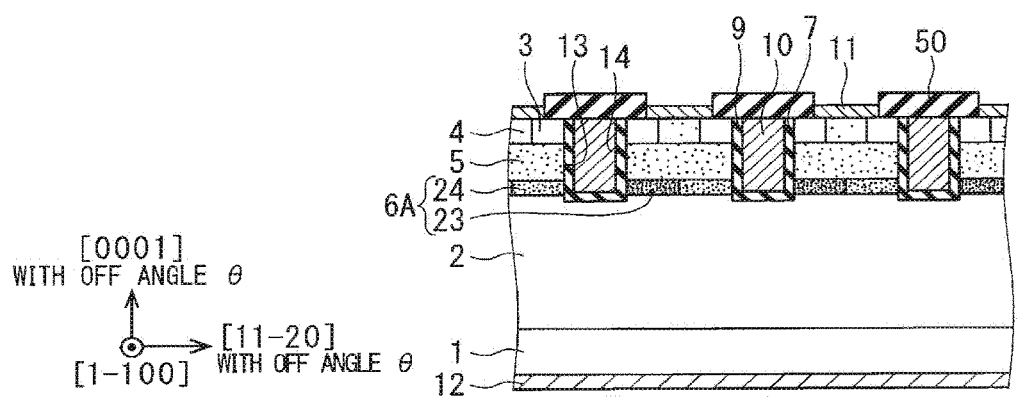
FIG. 8 is a cross section schematically showing an exemplary structure to achieve a silicon carbide semiconductor device in accordance with another preferred embodiment.

FIG. 8 is a cross section schematically showing an exemplary structure to achieve a silicon carbide semiconductor device in accordance with the present preferred embodiment. In FIG. 8, an upper direction of the paper is the [0001] direction with an off angle θ, a right direction of the paper is the [11-20] direction with the off angle θ, and a frontward direction of the paper is the [1-100] direction. As exemplarily shown in FIG. 8, in the silicon carbide semiconductor device, an n-type depletion suppressing layer 6A having an impurity concentration higher than that of the silicon carbide drift layer 2 is formed on the lower surface of the p-type body region 5 which is an active region, i.e., in the vicinity of the interface between the body region 5 and the silicon carbide drift layer 2.

The depletion suppressing layer 6A has an n-type high concentration layer 23 having an impurity concentration higher than that of the silicon carbide drift layer 2 and a low concentration layer 24 having an impurity concentration lower than that of the high concentration layer 23 and higher than that of the silicon carbide drift layer 2. The low concentration layer 24 is positioned in the vicinity of the first side wall surface 13 of the trench 7. Further, the high concentration layer 23 is positioned in the vicinity of the second side wall surface 14 of the trench 7. Herein, the silicon carbide drift layer 2 may be interposed between the high concentration layer 23 and the low concentration layer 24. Further, the silicon carbide drift layer 2 may be interposed between the high concentration layer 23 and the second side wall surface 14. The silicon carbide drift layer 2 may be interposed between the low concentration layer 24 and the first side wall surface 13.

<Manufacturing Method of Silicon Carbide Semiconductor Device>

The above-described structure can be manufactured by a manufacturing method described below. First, in a state where the body contact region 4 and the source region 3 are formed on the surface of the silicon carbide drift layer 2 and the body region 5 is further formed at a position in contact with the lower surface of the source region 3 and the lower surface of the body contact region 4, a mask is formed across the upper surface of the body contact region 4 and the upper surface of the source region 3. The mask has an opening in part of a region extending from the upper surface of the body contact region 4 toward the [−1-120] direction with the off angle θ, to reach the upper surface of the source region 3. In the upper surface of the source region 3, the opening is formed up to a position of the second side wall surface 14 of the trench 7 formed in the later step. Alternatively, in the upper surface of the source region 3, the opening is formed up to a position away from the position of the second side wall surface 14 of the trench 7 formed in the later step, by the second distance X2.

Then, by performing an ion implantation from above the mask toward below the body region 5, formed is the high concentration layer 23 having a first impurity concentration higher than that of the silicon carbide drift layer 2.

Next, the mask is removed. Then, a mask is formed across the upper surface of the body contact region 4 and the upper surface of the source region 3. The mask has an opening in part of a region extending from the upper surface of the body contact region 4 toward the [11-20] direction with the off angle θ, to reach the upper surface of the source region 3. In the upper surface of the source region 3, the opening is formed up to a position of the first side wall surface 13 of the trench 7 formed in the later step. Alternatively, in the upper surface of the source region 3, the opening is formed up to a position away from the position of the first side wall surface 13 of the trench 7 formed in the later step, by the first distance X1.

Then, by performing an ion implantation from above the mask toward below the body region 5, formed is the low concentration layer 24 having a second impurity concentration lower than that of the high concentration layer 23 and higher than that of the silicon carbide drift layer 2.

Further, the high concentration layer 23 and the low concentration layer 24 may be formed by epitaxial growth at the same positional relation in the surface of the silicon carbide drift layer 2. Furthermore, the order of the process steps for manufacturing the high concentration layer 23 and the low concentration layer 24 may be changed.

In the above-described structure, the following effects can be produced.

Figure 14:
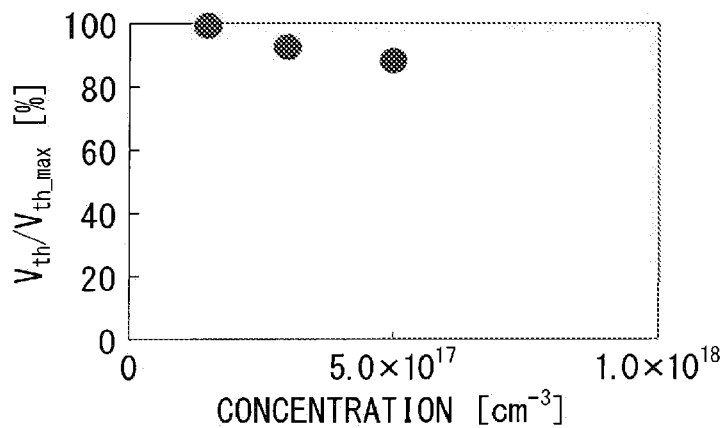
FIG. 14 is a graph exemplarily showing a calculation result of a relation of a threshold voltage with respect to an n-type impurity concentration of the depletion suppressing layer in the silicon carbide semiconductor device in accordance with the preferred embodiment.
Figure 15:
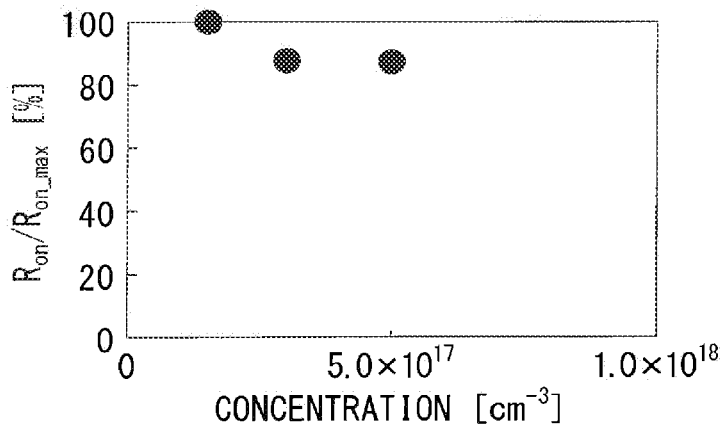
FIG. 15 is a graph exemplarily showing a calculation result of a relation of an ON-resistance with respect to an n-type impurity concentration of the depletion suppressing layer in the case where the gate voltage is 15 V in the silicon carbide semiconductor device in accordance with the preferred embodiment.
Figure 16:
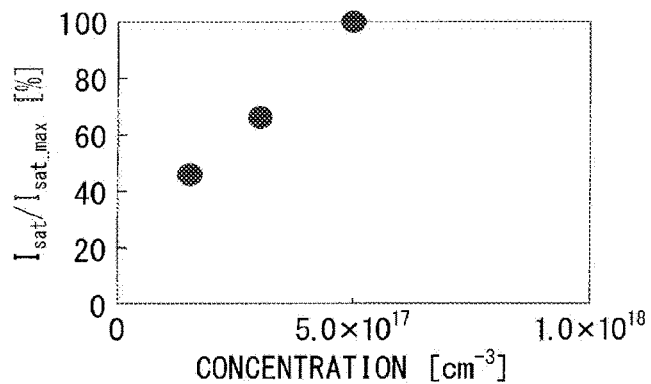
FIG. 16 is a graph exemplarily showing a calculation result of a relation of a saturation current with respect to an n-type impurity concentration of the depletion suppressing layer in the silicon carbide semiconductor device in accordance with the preferred embodiment.

FIG. 14 is a graph exemplarily showing a calculation result of a relation of a threshold voltage with respect to the n-type impurity concentration of the depletion suppressing layer 6A in the silicon carbide semiconductor device in accordance with the present preferred embodiment. In FIG. 14, the vertical axis represents a ratio of the calculated threshold voltage to a maximum value by percentage, and the horizontal axis represents the n-type impurity concentration [cm$^{-3}$] of the depletion suppressing layer 6A. FIG. 15 is a graph exemplarily showing a calculation result of a relation of an ON-resistance with respect to the n-type impurity concentration of the depletion suppressing layer 6A in the case where the gate voltage is 15 V in the silicon carbide semiconductor device in accordance with the present preferred embodiment. In FIG. 15, the vertical axis represents a ratio of the calculated ON-resistance to a maximum value by percentage, and the horizontal axis represents the n-type impurity concentration [cm$^{-3}$] of the depletion suppressing layer 6A. FIG. 16 is a graph exemplarily showing a calculation result of a relation of a saturation current with respect to the n-type impurity concentration of the depletion suppressing layer 6A in the silicon carbide semiconductor device in accordance with the present preferred embodiment. In FIG. 16, the vertical axis represents a ratio of the calculated saturation current to a maximum value by percentage, and the horizontal axis represents the n-type impurity concentration [cm-3] of the depletion suppressing layer 6A.

In FIGS. 14 to 16, the structure is formed, assuming that the p-type impurity concentration of the body region 5 is $3\times10^{17}$ cm$^{-3}$, and the n-type impurity concentration of the depletion suppressing layer 6A is not lower than about $1.5\times10^{17}$ cm$^{-3}$ and not higher than about $5\times10^{17}$ cm$^{-3}$.

As exemplarily shown in FIG. 14, the threshold voltage of the silicon carbide semiconductor device decreases as the impurity concentration of the depletion suppressing layer 6A becomes higher. This is because the effect produced on a profile of a channel region formed in the vicinity thereof increases as the impurity concentration of the depletion suppressing layer 6A becomes higher, and the effective carrier concentration decreases.

As exemplarily shown in FIG. 15, similarly, the ON-resistance of the silicon carbide semiconductor device also decreases as the impurity concentration of the depletion suppressing layer 6A becomes higher. In a region where the impurity concentration is high, however, the change rate becomes small.

This is because the effect that the difference in the impurity concentration gives the path for the ON-state current, which is formed therebelow, becomes smaller as the impurity concentration of the depletion suppressing layer 6A becomes higher. In other words, this is because the change in the ON-state current path with respect to the change in the concentration of the depletion suppressing layer 6A becomes duller as the impurity concentration of the depletion suppressing layer 6A becomes higher.

As exemplarily shown in FIG. 16, a saturation current value of the silicon carbide semiconductor device largely increases as the impurity concentration of the depletion suppressing layer 6A becomes higher.

Herein, since the preferable change rate of each of the properties of the silicon carbide semiconductor device are different depending on the structure condition of the used element, the values are not limited to these shown in FIGS. 14 to 16.

Thus, in the silicon carbide semiconductor device of the present preferred embodiment, the high concentration layer 23 which promotes the flow of the current is formed in a crystal plane in which the threshold voltage or the ON-resistance is high, and the low concentration layer 24 which suppresses the flow of the current is formed in a crystal plane in which the threshold voltage or the ON-resistance is low. Since the device has such a structure, by adjusting the impurity concentration of each layer, it is possible to control the channel characteristics of each crystal plane. Therefore, it is possible to reduce a variation in the current in the element surface due to the off angle θ.

The Third Preferred Embodiment

A silicon carbide semiconductor device in accordance with the present preferred embodiment will be described. In the following description, constituent elements identical to those described in the above-described preferred embodiments are represented by the same reference signs and detailed description thereof will be omitted as appropriate.

<Structure of Silicon Carbide Semiconductor Device>

Figure 9:
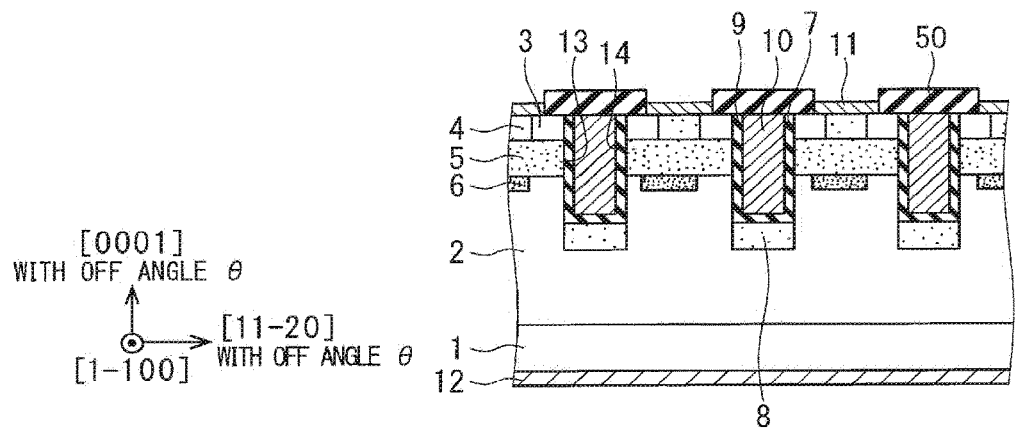
FIG. 9 is a cross section schematically showing an exemplary structure to achieve a silicon carbide semiconductor device in accordance with still another preferred embodiment.

FIG. 9 is a cross section schematically showing an exemplary structure to achieve a silicon carbide semiconductor device in accordance with the present preferred embodiment. In FIG. 9, an upper direction of the paper is the [0001] direction with an off angle θ, a right direction of the paper is the [11-20] direction with the off angle θ, and a frontward direction of the paper is the [1-100] direction. As exemplarily shown in FIG. 9, in the silicon carbide semiconductor device, a trench bottom-surface protective layer 8 having a conductivity type opposite to that of the silicon carbide drift layer 2 is formed on a bottom surface of the trench 7.

<Manufacturing Method of Silicon Carbide Semiconductor Device>

The above-described structure can be manufactured by a manufacturing method described below. After forming the trench 7 by the same method as described in the first preferred embodiment, the trench bottom-surface protective layer 8 is formed on the bottom surface of the trench 7 by using an acceptor impurity having a concentration not lower than $5 \times 10^{17}$ cm$^{-3}$ and not higher than $5 \times 10^{18}$ cm$^{-3}$. The trench bottom-surface protective layer 8 may be formed by ion implantation, or after the trench 7 is formed as deep as the thickness of the trench bottom-surface protective layer 8, the trench bottom-surface protective layer 8 may be formed by performing an epitaxial growth inside the trench 7.

In the above-described structure, the following effects can be produced.

When a high voltage is applied to the silicon carbide semiconductor device, the electric field extending inside the silicon carbide drift layer 2 is concentrated on the bottom surface of the trench 7. Since the gate insulating film 9 is formed on the bottom surface of the trench 7, when a high electric field is applied to the bottom surface of the trench 7, a load is imposed on the gate insulating film 9 and this causes deterioration of the reliability or breakage of the device in some cases. As shown in the first preferred embodiment and the second preferred embodiment, particularly, when a layer having a high impurity concentration, such as the depletion suppressing layer 6, is formed inside the silicon carbide drift layer 2, the electric field strength therearound becomes higher and the breakdown voltage of the silicon carbide semiconductor device is reduced in some cases.

In the silicon carbide semiconductor device of the present preferred embodiment, since the trench bottom-surface protective layer 8 having a conductivity type opposite to that of the silicon carbide drift layer 2 is formed on the bottom surface of the trench 7, the electric field is concentrated on the trench bottom-surface protective layer 8 and this prevents a high electric field from being applied to the bottom surface of the trench 7. Further, the bottom surface of the trench 7 is not directly exposed to the electric field extending around the depletion suppressing layer 6. Then, since a depletion layer is extended from the trench bottom-surface protective layer 8 into the silicon carbide drift layer 2, the electric field strength in the silicon carbide drift layer 2 is reduced.

Herein, the trench bottom-surface protective layer 8 may be electrically connected to the source electrode 11. This can reduce the gate-drain capacitance and improve the switching characteristics. Further, at the same time, it is possible to promote the growth of the depletion, layer from the trench bottom-surface protective layer 8 and increase the effect of reducing the electric field in the silicon carbide semiconductor device. As described above, by forming the trench bottom-surface protective layer 8, it is possible to increase the reliability of the gate insulating film 9 and the breakdown voltage of the silicon carbide semiconductor device.

The Fourth Preferred Embodiment

A silicon carbide semiconductor device in accordance with the present preferred embodiment will be described. In the following description, constituent elements identical to those described in the above-described preferred embodiments are represented by the same reference signs and detailed description thereof will be omitted as appropriate.

<Structure of Silicon Carbide Semiconductor Device>

Figure 10:
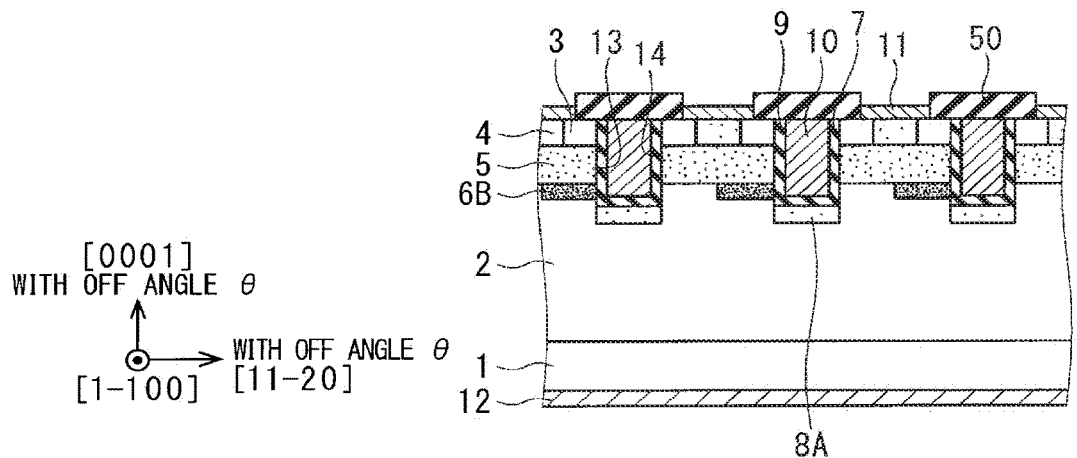
FIG. 10 is a cross section schematically showing an, exemplary structure to achieve a silicon carbide semiconductor device in accordance with yet another preferred embodiment.

FIG. 10 is a cross section schematically showing an exemplary structure to achieve a silicon carbide semiconductor device in accordance with the present preferred embodiment. In FIG. 10, an upper direction of the paper is the [0001] direction with an off angle θ, a right direction of the paper is the [11-20] direction with the off angle θ, and a frontward direction of the paper is the [1-100] direction. As exemplarily shown in FIG. 10, in the silicon carbide semiconductor device, an n-type depletion suppressing layer 6B having an impurity concentration higher than that of the silicon carbide drift layer 2 is formed on the lower surface of the body region 5. The depletion suppressing layer 6B is positioned in contact with the first side wall surface 13 of the trench 7 and away from the second side wall surface 14 of the trench 7. Further, as exemplarily shown in FIG. 10, in the silicon carbide semiconductor device, a trench bottom-surface protective layer 8A having a conductivity type opposite to that of the silicon carbide drift layer 2 is formed on the bottom surface of the trench 7. An upper end of the trench bottom-surface protective layer 8A is positioned deeper than a lower end of the depletion layer extending from the body region 5 into the depletion suppressing layer 6B and shallower than a lower end of the depletion layer extending from the body region 5 into the silicon carbide drift layer 2.

<Manufacturing Method of Silicon Carbide Semiconductor Device>

The above-described structure can be manufactured by a manufacturing method described below. First, in a state where the body contact region 4 and the source region 3 are formed on the surface of the silicon carbide drift layer 2 and the body region 5 is further formed, at a position in contact with the lower surface of the source region 3 and the lower surface of the body contact region 4, a mask is formed across the upper surface of the body contact region 4 and the upper surface of the source region 3. The mask has an opening in part of a region extending from the upper surface of the body contact region 4 toward the [11-20] direction with the off angle θ, to reach the upper surface of the source region 3. In the upper surface of the source region 3, the opening is formed up to a position of the first side wall surface 13 of the trench 7 formed in the later step.

Then, by performing an ion, implantation from above the mask toward below the body region 5, the depletion suppressing layer 6B having an impurity concentration higher than that of the silicon carbide drift layer 2 is formed. Further, at the same position, the depletion suppressing layer 6B may be formed by epitaxial growth. The trench bottom-surface protective layer 8A is formed by ion implantation or epitaxial growth so that the upper end of the trench bottom-surface protective layer 8A may be positioned deeper than a depth Y1 described later and shallower than a depth Y2 described later. Furthermore, the order of the process steps for forming the depletion suppressing layer 6B may be changed.

In the above-described structure, the following effects can be produced.

First, the path for the ON-state current is formed between the p-type body region 5 and the trench bottom-surface protective layer 8A, but in the silicon carbide drift layer 2 sandwiched by the p-type regions, a JFET (Junction Field Effect Transistor) effect arises and the resistance thereby becomes larger. The width of the depletion layer extending from the p-type region to the n-type region in a pn junction between the p-type region and the n-type region can be estimated from Eq. 1 described below. The width $l_n$ of the depletion layer in the n-type region is calculated by the p-type impurity concentration, the n-type impurity concentration, and a voltage (an ON-state voltage) applied across the drain electrode 12 and the source electrode 11 in an ON state.

[Eq. 1]

$$l_n = \frac{N_a}{N_a + N_d} \sqrt{\frac{2\varepsilon_s}{q}\left(\frac{1}{N_a} + \frac{1}{N_d}\right)(\Phi_{bi} - V_a)} \quad (1)$$

In calculating the width of the depletion layer extending below the body region 5, in Eq. 1, "$N_a$" represents a acceptor concentration of the body region 5, "$N_d$" represents a donor concentration of the depletion suppressing layer 6B or the silicon carbide drift layer 2, "$\varepsilon_s$," represents a semiconductor dielectric constant, "q" represents an elementary electric charge, "$\Phi_{bi}$" represents a diffusion potential, and "$V_a$" represents a applied bias (ON-state voltage). The diffusion potential $\Phi_{bi}$ can be obtained by using Eq. 2 described below.

[Eq. 2]

$$\Phi_{bi} = \frac{kT}{q}\ln\frac{N_a N_d}{n_i^2} \quad (2)$$

In Eq. 2, "k" represents a Boltzmann constant, "T" represents a temperature, and "$n_i$" represents an intrinsic carrier concentration.

When it is assumed that the width of the depletion layer extending from the lower surface of the body region 5 into the depletion suppressing layer 6B is $l_{n1}$, the lower end of this depletion layer is positioned lower from the lower surface of the body region 5 by $l_{n1}$. The position of the lower end of the depletion layer extending from below the body region 5 into the depletion suppressing layer 6B is assumed to be the depth Y1.

Further, when it is assumed that the width of the depletion layer extending from the lower surface of the body region 5 into the silicon carbide drift layer 2 is $l_{n2}$, the lower end of this depletion layer is positioned lower from the lower surface of the body region 5 by $l_{n2}$. The position of the lower end of the depletion layer extending from below the body region 5 into the silicon carbide drift layer 2 is assumed to be the depth Y2.

Figure 17:
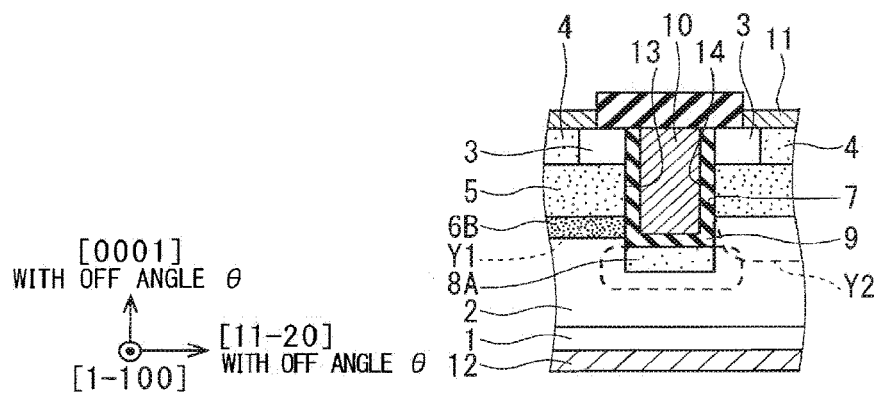
FIG. 17 is a cross section showing an exemplary structure to achieve a silicon carbide semiconductor device in accordance with the preferred embodiment, with the vicinity of the trench enlarged.

In the present preferred embodiment, when the trench 7 is formed so that the bottom surface thereof is positioned deeper than the depth Y1 and shallower than the depth Y2, the structure exemplarily, shown in FIG. 17 can be obtained. FIG. 17 is a cross section showing, an exemplary structure to achieve the silicon carbide semiconductor device in accordance with the present preferred embodiment, with the vicinity of the trench enlarged. In FIG. 17, an upper direction of the paper is the [0001] direction with an off angle θ, a right direction of the paper is the [11-20] direction with the off angle θ, and a frontward direction of the paper is the [1-100] direction.

As exemplarily shown in FIG. 17, since the upper end of the trench bottom-surface protective layer 8A is positioned deeper than the depth Y1 in the vicinity of the first side wall surface 13 where the depletion suppressing layer 6B is formed, the path for the ON-state current is formed at a position deeper than the depth Y1. On the other hand, since the upper end of the trench bottom-surface protective, layer 8A is positioned shallower than the depth Y2 in the vicinity of the second side wall surface 14 where the depletion suppressing layer 6B is not formed, the second side wall surface 14 and the silicon carbide semiconductor substrate 1 are separated from each other by the depletion layer extending from the trench bottom-surface protective layer 8A and the depletion layer extending from the body region 5. Therefore, the ON-state current does not flow.

In other words, below the body region 5 in the (11-20) plane with the off angle θ, the depletion suppressing layer 6B is formed at a position in contact with the (11-20) plane with the off angle θ. Further, below the body region 5 in the (-1-120) plane with the off angle θ, the silicon carbide drift layer 2 is formed at a position in contact with the (-1-120) plane with the off angle θ. Then, the depth of the trench 7 can be expressed as follows.

[Eq. 3]

$$\text{depth } Y1 < \text{depth of trench} < \text{depth } Y2 \quad (3)$$

Therefore, it is possible to disable only the channel formed in a plane in which the current is hard to flow, in other words, to make such a control as not to form any channel in a plane in which the current is hard to flow. Therefore, it is possible to suppress a variation in the current in the silicon carbide semiconductor device and increase the reliability of the silicon carbide semiconductor device.

Further, though the silicon carbide semiconductor device in which a main surface of the silicon carbide semiconductor substrate 1 has an off angle inclined from the (0001) plane toward the [11-20] direction has been described in the above-described preferred embodiments, the main surface of the silicon carbide semiconductor substrate 1 and the crystal axis direction with the off angle are not limited to these examples. Therefore, in a case where the main surface of the silicon carbide semiconductor substrate 1 is not the (0001) plane or another case where the main surface of the silicon carbide semiconductor substrate 1 has an off angle inclined in a direction other than the [11-20] direction, the first side wall surface 13 of the trench 7 is not the (11-20) plane with the off angle θ but a plane orthogonal to the crystal axis direction with an inclination of the off angle, and the second side wall surface 14 is also not the (-1-120) plane with the off angle θ but a plane in parallel with the first side wall surface 13 and opposite thereto with the gate electrode 10 interposed therebetween.

Furthermore, in the respective silicon carbide semiconductor devices of the above-described preferred embodiments, the off angle θ has only to be larger than 0 degrees and the value of the off angle θ is not particularly limited.

Effects of the Above-Described Preferred Embodiments

Hereinafter, the effects of the above-described preferred embodiments will be described. In, the following description, though the effects based on the specific structures shown in the above-described preferred embodiments will be described, the structure may be replaced by any other specific structure shown in the present specification within the scope where the same effects can be produced. Further, this replacement may be made across a plurality of preferred embodiments. In other words, the respective structures shown in the different preferred embodiments may be combined to produce the same effects.

In the above-described preferred embodiments, the silicon carbide semiconductor device includes a silicon carbide drift layer 2 of the first conductivity type, a body region 5 of the second conductivity type, a source region 3 of the first conductivity type, a plurality of trenches 7, a gate insulating film 9, a gate electrode 10, a source electrode 11, a drain electrode 12, and a depletion suppressing layer 6 of the first conductivity type. The silicon carbide drift layer 2 is formed on an upper surface of a silicon carbide semiconductor substrate 1 having, an off angle. The body region 5 is formed on an upper surface of the silicon carbide drift layer 2. The source region 3 is partially formed on a surface layer of the body region 5. The plurality of trenches 7 penetrate the body region 5 from an upper surface of the source region 3, to reach the silicon carbide drift layer 2. The gate insulating film 9 is formed on a wall surface inside each of the plurality of trenches 7. The gate electrode 10 is so formed inside each of the plurality of trenches 7 as to cover the gate insulating film 9. The source electrode 11 is so formed as to cover the source region 3. The drain electrode 12 is formed on a lower surface side of the silicon carbide drift layer 2. The depletion suppressing layer 6 is formed on a lower surface of the body region 5 and has an impurity concentration higher than that of the silicon carbide drift layer 2. The depletion suppressing layer 6 is so positioned as to be sandwiched between the plurality of trenches in a plan view. In a direction with the off angle of the silicon carbide semiconductor substrate 1, a distance between the depletion suppressing layer 6 and one of the trenches 7 adjacent to the depletion suppressing layer 6 is different from another distance between the depletion suppressing layer 6 and the other one of the trenches 7 adjacent to the depletion suppressing layer 6.

When the distance between the depletion suppressing layer 6 and the side wall surface of the trench 7 is short, the current is easy to flow in since the path for the ON-state current is kept wide. On the other hand, when the distance between the depletion suppressing layer 6 and the side wall surface of the trench 7 is long, the current becomes hard to flow in since the path for the ON-state current becomes narrow. Therefore, in such a structure, by adjusting the distance between the depletion suppressing layer 6 and the side wall surface of the trench 7 in accordance with the crystal plane, it is possible to suppress the difference in the ON-state current among the side wall surfaces of each trench 7 and suppress the variation in the current and the variation in the threshold voltage in the silicon carbide semiconductor device. Therefore, it is possible to achieve a silicon carbide semiconductor device which is stable and ensures high reliability.

The constituent elements shown in the present specification other than these constituent elements may be omitted as appropriate. In other words, only these constituent elements can produce the above-described effects. Even in a case where at least one of the other constituent elements shown in the present specification is added to the above-described constituent elements as appropriate, i.e., a case where the other constituent elements shown in the present specification, which are not described as the above-described constituent elements, are added to the above-described constituent elements, however, the same above-described effects can be produced.

Further, in the above-described preferred embodiments, the silicon carbide semiconductor device includes a trench bottom-surface protective layer 8 of the second conductivity type formed on a bottom surface of the trench 7. Since such a structure can suppress applying a high electric field to the bottom surface of the trench 7, it is possible to reduce the electric field strength applied to the gate insulating film 9 and increase the reliability of the gate insulating film 9.

Furthermore, in the above-described preferred embodiments, a distance between the depletion suppressing layer 6 and one of the trenches 7 adjacent thereto in a downward direction of the crystal plane inclined by the off angle from the upper surface of the silicon carbide drift layer 2 is shorter than another distance between the depletion suppressing layer 6 and the other one of the trenches 7 adjacent thereto in an upward direction of the crystal plane inclined by the off angle from the upper surface of the silicon carbide drift layer 2. In such a structure, the current path in the vicinity of the channel region formed on the first side wall surface 13 which is a crystal plane in which the current is easy to flow can be made narrower by not forming the depletion suppressing layer 6 in the vicinity. On the other hand, the current path in the vicinity of the channel region formed on the second side wall surface 14 which is a crystal plane in which the current is hard to flow can be made wider by forming the depletion suppressing layer 6 in the vicinity. Therefore, it is possible to suppress the difference in the ON-state current among the side wall surfaces of each trench 7 and suppress the variation in the current and the variation in the threshold voltage in the silicon carbide semiconductor device.

In the above-described preferred embodiments, the depletion suppressing layer 6B is away from one of the trenches 7 adjacent thereto in a downward direction of the crystal plane inclined by the off angle from the upper surface of the silicon carbide drift layer 2. Then, the depletion suppressing layer 6B is positioned in contact with the other one of the trenches 7 adjacent thereto in an upward direction of the crystal plane inclined by the off angle from the upper surface of the silicon carbide drift layer 2. Further, the upper surface of the trench bottom-surface protective layer 8A is positioned deeper than the lower end of the depletion layer extending from the body region 5 into the depletion suppressing layer 6B. Then, the upper surface of the trench bottom-surface protective layer 8A is positioned shallower than the lower end of the depletion layer extending from the body region 5 into the silicon carbide drift layer 2. In such a structure, by disabling only the channel formed on the second side wall surface 14 which is a crystal plane in which the current is hard to flow and controlling the current not to flow in the current path on the second side wall surface 14, it is possible to suppress the difference in the ON-state current among the side wall surfaces of each trench 7 and suppress the variation in the current and the variation in the threshold voltage in the silicon carbide semiconductor device.

Further, in the above-described preferred embodiments, the threshold voltage in a field effect transistor formed on a side wall surface of the trench 7 in a downward direction of the crystal plane inclined by the off angle from the upper surface of the silicon carbide drift layer 2 is equal to that in a field effect transistor formed on a side wall surface of the trench 7 in an upward direction of the crystal plane inclined by the off angle from the upper surface of the silicon carbide drift layer 2. In such a structure, by adjusting the distance between the depletion suppressing layer 6 and the side wall surface of the trench 7 in accordance with the crystal plane, it is possible to suppress the difference in the ON-state current among the side wall surfaces of each trench 7 and suppress the variation in the current and the variation in the threshold voltage in the silicon carbide semiconductor device.

In the above-described preferred embodiments, the silicon carbide semiconductor device includes a silicon carbide drift layer 2 of the first conductivity type, a body region 5 of the second conductivity type, a source region 3 of the first conductivity type, a plurality of trenches 7, a gate insulating film 9, a gate electrode 10, a source electrode 11, a drain electrode 12, and a depletion suppressing layer 6A of the first conductivity type. The silicon carbide drift layer 2 is formed on an upper surface of a silicon carbide semiconductor substrate 1 having an off angle. The body region 5 is formed on an upper surface of the silicon carbide drift layer 2. The source region 3 is partially formed on a surface layer of the body region 5. The plurality of trenches 7 penetrate the body region 5 from an upper surface of the source region 3, to reach the silicon carbide drift layer 2. The gate insulating film 9 is formed on a wall surface inside each of the plurality of trenches 7. The gate electrode 10 is so formed inside each of the plurality of trenches 7 as to cover the gate insulating film 9. The source electrode 11 is so formed as to cover the source region 3. The drain electrode 12 is formed on a lower surface side of the silicon carbide drift layer 2. The depletion suppressing layer 6A is formed on a lower surface of the body region 5 and has an impurity concentration higher than that of the silicon carbide drift layer 2. The depletion suppressing layer 6A is so positioned as to be sandwiched between the plurality of trenches 7 in a plan view. The depletion suppressing layer 6A has a first layer and a second layer. Herein, the high concentration layer 23 corresponds to the first layer. The low concentration layer 24 corresponds to the second layer. The high concentration layer 23 is positioned on a downward side of a crystal plane inclined by the off angle from the upper surface of the silicon carbide drift layer 2. The low concentration layer 24 is positioned on an upward side of the crystal plane inclined by the off angle from the upper surface of the silicon carbide drift layer 2. The high concentration layer 23 has an impurity concentration higher than that of the low concentration layer 24. In such a structure, since the low concentration layer 24 is positioned on a side of the first side wall surface 13 which is a crystal plane in which the current is easy to flow and the high concentration layer 23 is positioned on a side of the second side wall surface 14 which is a crystal plane in which the current is hard to flow, it is possible to suppress the difference in the ON-state current among the side wall surfaces of each trench 7 and suppress the variation in the current and the variation in the threshold voltage in the silicon carbide semiconductor device. Therefore, it is possible to achieve a silicon carbide semiconductor device which is stable and ensures high reliability.

Further, in the above-described preferred embodiments, a distance between the high concentration layer 23 and one of the trenches 7 adjacent thereto in a downward direction of the crystal plane inclined by the off angle from the upper surface of the silicon carbide drift layer 2 is shorter than another distance between the low concentration layer 24 and the other one of the trenches 7 adjacent thereto in an upward direction of the crystal plane inclined by the off angle from the upper surface of the silicon carbide drift layer 2. In such a structure, by adjusting the distance between the first side wall surface 13 and the low concentration layer 24 and the distance between the second side wall surface 14 and the high concentration layer 23, it is possible to suppress the difference in the ON-state current among the side wall surfaces of each trench 7 and suppress the variation in the current and the variation in the threshold voltage in the silicon carbide semiconductor device.

Furthermore, in the above-described preferred embodiments, the trench bottom-surface protective layer 8 is electrically connected to the source electrode 11. In such a structure, it is possible to reduce the gate-drain capacitance and improve the switching characteristics. Further, it is possible to promote the growth of the depletion layer from the trench bottom-surface protective layer 8, to reduce the electric field in the silicon carbide drift layer 2, and to reduce the electric field strength applied to the gate insulating film 9.

In the above-described preferred embodiments, the silicon carbide semiconductor substrate 1 has an off angle inclined from the (0001) plane toward the [11-20] axis direction. Further, a side wall surface of the trench 7 in a downward direction of the crystal plane inclined by the off angle from the upper surface of the silicon carbide drift layer 2 is a (−1-120) plane. A side wall surface of the trench 7 in an upward direction of the crystal plane inclined by the off angle from the upper surface of the silicon carbide drift layer 2 is a (11-20) plane. In such a structure, by adjusting the distance between the depletion suppressing layer 6 and the side wall surface of the trench 7 in accordance with the crystal plane, it is possible to suppress the difference in the ON-state current among the side wall surfaces of each trench 7 and suppress the variation in the current and the variation in the threshold voltage in the silicon carbide semiconductor device.

Further, in the above-described preferred embodiments, the off angle of the silicon carbide semiconductor substrate 1 is not smaller than 1 degree and not larger than 10 degrees. In such a structure, by adjusting the distance between the depletion suppressing layer 6 and the side wall surface of the trench 7 in accordance with the crystal plane, it is possible to suppress the difference in the ON-state current among the side wall surfaces of each trench 7 and suppress the variation in the current and the variation in the threshold voltage in the silicon carbide semiconductor device.

Furthermore, in the above-described preferred embodiments, an impurity concentration of the first conductivity type of the depletion suppressing layer 6 is not lower than $1\times10^{17}$ cm$^{-3}$ and not higher than $5\times10^{17}$ cm$^{-3}$. In such a structure, since the width of the depletion layer extending below the body region 5 can be effectively reduced, it is possible to reduce the thickness of the depletion suppressing layer 6.

Variations of the Above-Described Preferred Embodiments

Though the above-described preferred embodiments describe, for example, the material quality, material, dimension, shape, relative arrangement relation, or implementation condition of each constituent element in some cases, these are exemplary in all aspects, and the present invention is not limited to those described in the present specification. Thus, an indefinite number of modifications and variations not exemplarily illustrated are assumed within the scope of the technique disclosed in the present specification. Examples of these modifications and variations include, for example, cases where at least one constituent element is deformed, where at least one constituent element is added or omitted, and where at least one constituent element in at least one preferred embodiment is extracted and combined with a constituent element in any other preferred embodiment.

When the above-described preferred embodiments describe that "one" constituent element is included, "one or more" constituent elements may be included, as long as no contradiction arises. Further, each constituent element is a conceptual unit, including cases where one constituent element is constituted of a plurality of structures, where one constituent element corresponds to part of a structure, and where a plurality of constituent elements are included in one structure. Furthermore, each constituent element includes a structure having any other constitution or shape, as long as the same function can be performed.

The description in the present specification can be referred to for all purposes as to the present technique, and is not recognized as the prior art.

When a material name or the like is described, not being particularly specified, in the above-described preferred embodiments, the material includes the same containing any other additive, such as an alloy, as long as no contradiction arises.

Though the semiconductor substrate is an n-type one in the above-described preferred embodiments, the semiconductor substrate may be a p-type one. In other words, though the MOSFET has been described as an example of the silicon carbide semiconductor device in the above-described preferred embodiments, a case where the exemplary silicon carbide semiconductor device is an insulated gate bipolar transistor (IGBT) can be assumed. In the case where the exemplary silicon carbide semiconductor device is an IGBT, though a layer of the conductivity type opposite to that of the drift layer is positioned on the lower surface of the drift layer, the layer positioned on the lower surface of the drift layer may be a layer which is newly formed on the lower surface of the drift layer or a substrate on which the drift layer is formed, like in the case described in the above preferred embodiments.

EXPLANATION OF REFERENCE SIGNS 1 silicon carbide semiconductor substrate, 2 silicon carbide drift layer, 3 source region, 4 body contact region, 5 body region, 6, 6A, 6B depletion suppressing layer, 7 trench, 8, 8A trench bottom-surface protective layer, 9 gate insulating film, 10 gate electrode, 11 source electrode, 12 drain electrode, 13 first side wall surface, 14 second side wall surface, 15 third side wall surface, 16 fourth side wall surface, 17, 18, 19, 20, 21 plane, 22 angle, 23 high concentration layer, 24 low concentration layer, 50 interlayer insulating film, X1 first distance, X2 second distance, X3 third distance, X4 fourth distance

The invention claimed is:

1. A silicon carbide semiconductor device, comprising:
a silicon carbide drift layer of a first conductivity type formed on an upper surface of a silicon carbide semiconductor substrate having an off angle;
a body region of a second conductivity type formed on an upper surface of the silicon carbide drift layer;
a source region of the first conductivity type which is partially formed on a surface layer of the body region;
a plurality of trenches penetrating the body region from an upper surface of the source region, to reach the silicon carbide drift layer;
a gate insulating film formed on a wall surface inside each of the plurality of trenches;
a gate electrode formed inside each of the plurality of trenches to cover the gate insulating film;
a source electrode formed to cover the source region;
a drain electrode formed on a lower surface side of the silicon carbide drift layer; and
a depletion suppressing layer of the first conductivity type formed on a lower surface of the body region and having an impurity concentration higher than that of the silicon carbide drift layer,
wherein the depletion suppressing layer is positioned to be sandwiched between the plurality of trenches in a plan view, and
a distance between the depletion suppressing layer and one of the trenches adjacent to the depletion suppressing layer is different from a distance between the depletion suppressing layer and the other one of the trenches adjacent to the depletion suppressing layer in a direction with the off angle of the silicon carbide semiconductor substrate.

2. The silicon carbide semiconductor device according to claim 1, further comprising:
a trench bottom-surface protective layer of the second conductivity type formed on a bottom surface of each of the trenches.

3. The silicon carbide semiconductor device according to claim 2, wherein
the depletion suppressing layer is positioned away from one of the trenches which is adjacent thereto in a downward direction of a crystal plane inclined by the off angle from the upper surface of the silicon carbide drift layer and positioned in contact with the other one of the trenches which is adjacent thereto in an upward direction of a crystal plane inclined by the off angle from the upper surface of the silicon carbide drift layer, and an upper surface of the trench bottom-surface protective layer is positioned deeper than a lower end of a depletion layer extending from the body region into the depletion suppressing layer and shallower than a lower end of a depletion layer extending from the body region into the silicon carbide drift layer.

4. The silicon carbide semiconductor device according to claim 2, wherein
the trench bottom-surface protective layer is electrically connected to the source electrode.

5. The silicon carbide semiconductor device according to claim 1, wherein
a distance between a side wall surface of each of the trenches in a downward direction of a crystal plane inclined by the off angle from the upper surface of the silicon carbide drift layer and the depletion suppressing layer adjacent thereto is shorter than a distance between a side wall surface of each of the trenches in an upward direction of the crystal plane inclined by the off angle from the upper surface of the silicon carbide drift layer and the depletion suppressing layer adjacent thereto.

6. The silicon carbide semiconductor device according to claim 1, wherein
a threshold voltage of a field effect transistor formed on the side wall surface of each of the trenches in the downward direction of the crystal plane inclined by the off angle from the upper surface of the silicon carbide drift layer is equal to that of a field effect transistor formed on the side wall surface of each of the trenches in the upward direction of the crystal plane inclined by the off angle from the upper surface of the silicon carbide drift layer.

7. The silicon carbide semiconductor device according to claim 1, wherein
the silicon carbide semiconductor substrate has an off angle inclined from a (0001) plane toward a [11-20] axis direction,
a side wall surface of each of the trenches in a downward direction of a crystal plane inclined by the off angle from the upper surface of the silicon carbide drift layer is a (-1-120) plane, and
a side wall surface of each of the trenches in an upward direction of the crystal plane inclined by the off angle from the upper surface of the silicon carbide drift layer is a (11-20) plane.

8. The silicon carbide semiconductor device according to claim 1, wherein
the off angle of the silicon carbide semiconductor substrate is not smaller than 1 degree and not larger than 10 degrees.

9. The silicon carbide semiconductor device according to claim 1, wherein
an impurity concentration of the first conductivity type of the depletion suppressing layer is not lower than $1 \times 10^{17}$ cm$^{-3}$ and not higher than $5 \times 10^{17}$ cm$^{-3}$.

10. A silicon carbide semiconductor device, comprising:
a silicon carbide drift layer of a first conductivity type formed on an upper surface of a silicon carbide semiconductor substrate having an off angle;
a body region of a second conductivity type formed on an upper surface of the silicon carbide drift layer;
a source region of the first conductivity type which is partially formed on a surface layer of the body region;
a plurality of trenches penetrating the body region from an upper surface of the source region, to reach the silicon carbide drift layer;
a gate insulating film formed on a wall surface inside each of the plurality of trenches;
a gate electrode formed inside each of the plurality of trenches to cover the gate insulating film;
a source electrode formed to cover the source region;
a drain electrode formed on a lower surface side of the silicon carbide drift layer; and
a depletion suppressing layer of the first conductivity type formed on a lower surface of the body region and having an impurity concentration higher than that of the silicon carbide drift layer,
wherein the depletion suppressing layer is positioned to be sandwiched between the plurality of trenches in a plan view,
the depletion suppressing layer has a first layer positioned on a downward side of a crystal plane inclined by the off angle from the upper surface of the silicon carbide drift layer and a second layer positioned on an upward side of the crystal plane inclined by the off angle from the upper surface of the silicon carbide drift layer, and
the first layer has an impurity concentration higher than that of the second layer.

11. The silicon carbide semiconductor device according to claim 10, wherein
a distance between the first layer and one of the trenches adjacent thereto in a downward direction of a crystal plane inclined by the off angle from the upper surface of the silicon carbide drift layer is shorter than a distance between the second layer and the other one of the trenches adjacent thereto in an upward direction of the crystal plane inclined by the off angle from the upper surface of the silicon carbide drift layer.

12. The silicon carbide semiconductor device according to claim 10, further comprising:
a trench bottom-surface protective layer of the second conductivity type formed on a bottom surface of each of the trenches.

13. The silicon carbide semiconductor device according to claim 12, wherein
the trench bottom-surface protective layer is electrically connected to the source electrode.

14. The silicon carbide semiconductor device according to claim 10, wherein
a threshold voltage of a field effect transistor formed on the side wall surface of each of the trenches in the downward direction of the crystal plane inclined by the off angle from the upper surface of the silicon carbide drift layer is equal to that of a field effect transistor formed on the side wall surface of each of the trenches in the upward direction of the crystal plane inclined by the off angle from the upper surface of the silicon carbide drift layer.

15. The silicon carbide semiconductor device according to claim 10, wherein
the silicon carbide semiconductor substrate has an off angle inclined from a (0001) plane toward a [11-20] axis direction,
a side wall surface of each of the trenches in a downward direction of a crystal plane inclined by the off angle from the upper surface of the silicon carbide drift layer is a (-1-120) plane, and
a side wall surface of each of the trenches in an upward direction of the crystal plane inclined by the off angle from the upper surface of the silicon carbide drift layer is a (11-20) plane.

16. The silicon carbide semiconductor device according to claim 10, wherein the off angle of the silicon carbide semiconductor substrate is not smaller than 1 degree and not larger than 10 degrees.

17. The silicon carbide semiconductor device according to claim 10, wherein
an impurity concentration of the first conductivity type of the depletion suppressing layer is not lower than $1\times10^{17}$ cm$^{-3}$ and not higher than $5\times10^{17}$ cm$^{-3}$.

\* \* \* \* \*